(12) United States Patent
Tatsumi et al.

(10) Patent No.: US 8,704,592 B2
(45) Date of Patent: Apr. 22, 2014

(54) TRAVELING WAVE AMPLIFIER WITH PRE-EMPHASIS FUNCTION

(75) Inventors: Taizou Tatsumi, Yokohama (JP); Keiji Tanaka, Yokohama (JP); Sosaku Sawada, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/428,374

(22) Filed: Mar. 23, 2012

(65) Prior Publication Data

US 2012/0249232 A1 Oct. 4, 2012

(30) Foreign Application Priority Data

Mar. 31, 2011 (JP) ................................. 2011-077814
Mar. 31, 2011 (JP) ................................. 2011-079306

(51) Int. Cl.
*H03F 3/60* (2006.01)

(52) U.S. Cl.
USPC .......................................... 330/53; 330/286

(58) Field of Classification Search
USPC .................. 330/53, 286, 124 R, 295
See application file for complete search history.

(56) References Cited

U.S. PATENT DOCUMENTS

| | | | |
|---|---|---|---|
| 3,593,174 A * | 7/1971 | White | 330/286 |
| 5,351,013 A * | 9/1994 | Alidio et al. | 330/284 |
| 5,367,267 A * | 11/1994 | Fuchs | 330/54 |
| 5,550,513 A | 8/1996 | Wong | |
| 7,368,997 B2 | 5/2008 | Suzuki | |

FOREIGN PATENT DOCUMENTS

| | | |
|---|---|---|
| JP | 10-510970 | 10/1998 |
| JP | 2003-304131 | 10/2003 |
| JP | 2006-54765 | 2/2006 |
| WO | 97/01219 | 1/1997 |

* cited by examiner

*Primary Examiner* — Henry Choe
(74) *Attorney, Agent, or Firm* — Smith, Gambrell & Russell, LLP

(57) ABSTRACT

A traveling wave amplifier (TWA) primarily for driving a semiconductor optical device is disclosed. The TWA of an embodiment provides a plurality of differential amplifiers of the first type and an additional differential amplifier of the second type, where are they are connected between the input and the output of the TWA. The differential amplifiers of the first type provide a first delay from the input to the output, while, the differential amplifier of the second type provide a second delay longer than the first delay between the input and the output of the TWA.

14 Claims, 10 Drawing Sheets

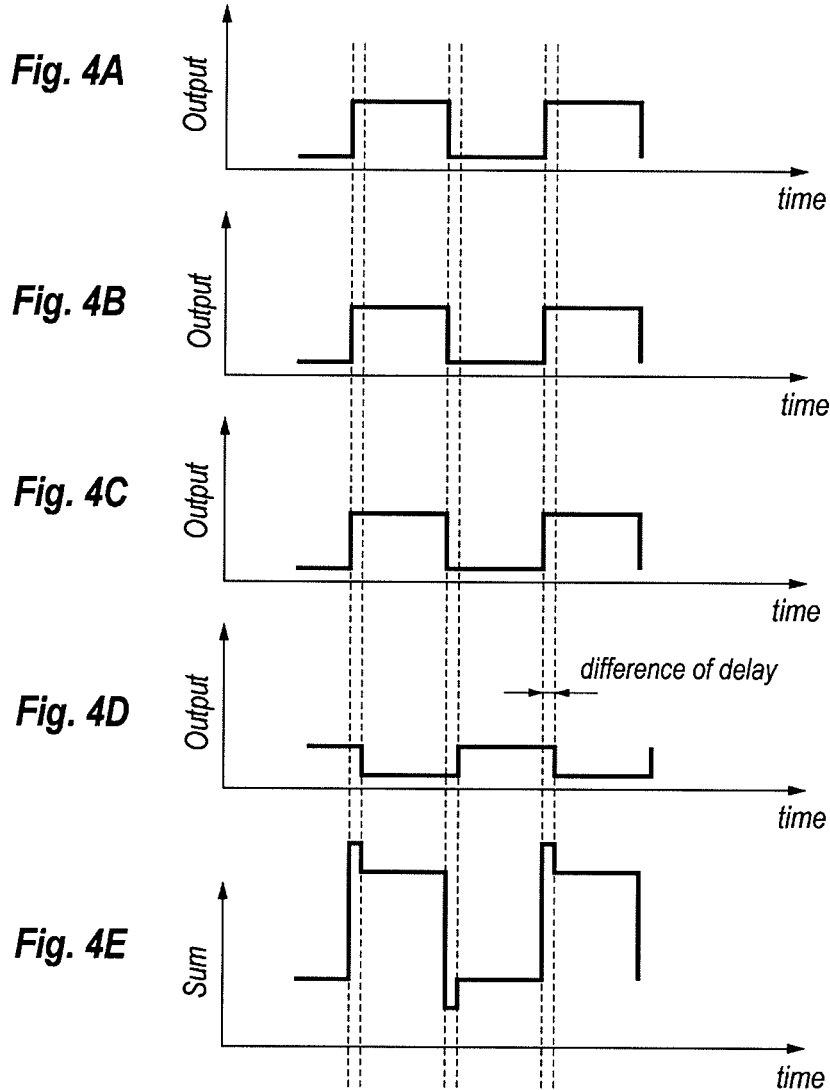

$V_{CE}=0.39V$ $V_{CE}=0.47V$ $V_{CE}=0.56V$ $V_{CE}=0.66V$ $V_{CE}=0.76V$ $V_{CE}=1.05V$

TRAVELING WAVE AMPLIFIER WITH PRE-EMPHASIS FUNCTION

BACKGROUND OF THE INVENTION

1. Field of the Invention

The present invention relates to a traveling wave amplifier (hereafter denoted as TWA) to drive, for instance, an optical modulator.

2. Related Background Art

Various types of TWAs have been disclosed in, for instance, Japanese Patent Applications published as JP-H10-510970, JP-2003-304131A, JP-2006-054765A, and/or United States patents, U.S. Pat. No. 5,550,513 and U.S. Pat. No. 7,368,997. A TWA ordinarily provides a plurality of amplifiers connected in parallel between input transmission lines and output transmission lines. An output of the TWA adds outputs of respective amplifiers by aligning their phases, or a delay from the input terminal to the output terminal, at the output terminal of the TWA.

When such a TWA is applied to be used as a driver, for instance, to drive an optical modulator or a semiconductor laser diode, the optical output provided from the optical modulator, or the laser diode, makes dull in the leading and falling edges of the optical output. Degradation in the edges in the optical signal becomes distinguishable when the operating speed of the TWA reaches, or sometime exceeds 10 Gbps in spite of an efficient use of a TWA in high frequency applications. A direct drive of the optical device by the TWA has been a practical technique.

SUMMARY OF THE INVENTION

One aspect according to an embodiment of the present invention relates to a TWA that comprises a plurality of non-inverting amplifiers and an inverting amplifier. These non-inverting and inverting amplifiers are connected in parallel between an input and an output of the TWA. Each of the non-inverting amplifiers provides a signal to the output with a first delay with respect to the input of the TWA; while, the inverting amplifier provides another signal to the output with a second delay, which is longer than the first delay, with respect to the input of the TWA. The TWA thus configured causes overshoot and undershoot in the output thereof but may shorten the rising and falling edges thereof.

The difference of two delays described above may be accomplished by transmission lines having distances different from others. Specifically, each of the non-inverting amplifiers receives the signal from the input with a time lag specific to respective non-inverting amplifiers and provides the signal to the output with another time lag also specific to respective non-inverting amplifiers but the sum of the former time land and the latter time lag is substantially equal to other non-inverting amplifiers. On the other hand, the inverting amplifier receives the signal from the input with another time lag specific thereto, and provides the signal to the output with a time lag which is longer than the other time lag attributed to the non-inverting amplifier. Accordingly, the signal coming from the inverting amplifier at the output of the TWA is, compared with the signals attributed to the non-inverting amplifiers reversed in the phase thereof and delayed, which causes the strengthened rising and falling edges of the output.

The difference of two delays may be accomplished by the installation of a non-inverting amplifier in series to the inverting amplifier. The inserted non-inverting amplifier causes a propagation delay between the input and the output thereof, which results in the difference between two delays.

The TWA according to an embodiment of the invention may have the differential architecture, that is, the non-inverting amplifiers and the inverting amplifiers above described may be a differential amplifier having two inputs and two outputs, and the transmission lines connecting between the input and those connecting between the output of respective amplifiers each includes two transmission lines running in parallel to the others.

Another aspect according to an embodiment of the present invention relates to a driver circuit using the TWA above described. The driver circuit of the embodiment is particularly adequate to drive a semiconductor optical device, such as a semiconductor laser diode and/or a semiconductor optical modulator. Such a device inevitably shows a dull rising and falling characteristic in the optical output therefrom. Driving such a device by a driver implementing with the TWA according to an embodiment of the invention, the optical characteristic of the output of the device may be enhanced.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

FIGS. 4A to 4D show components of respective signal paths of the TWA, and FIG. 4E show a summed waveform appeared in the output of the TWA;

DESCRIPTION OF PREFERRED EMBODIMENTS

Next, some preferred embodiments according to the present invention will be described as referring to drawings. In the description of the drawings, the same elements will be referred by the numerals or symbols same to each other without overlapping explanations.

Figure 1:
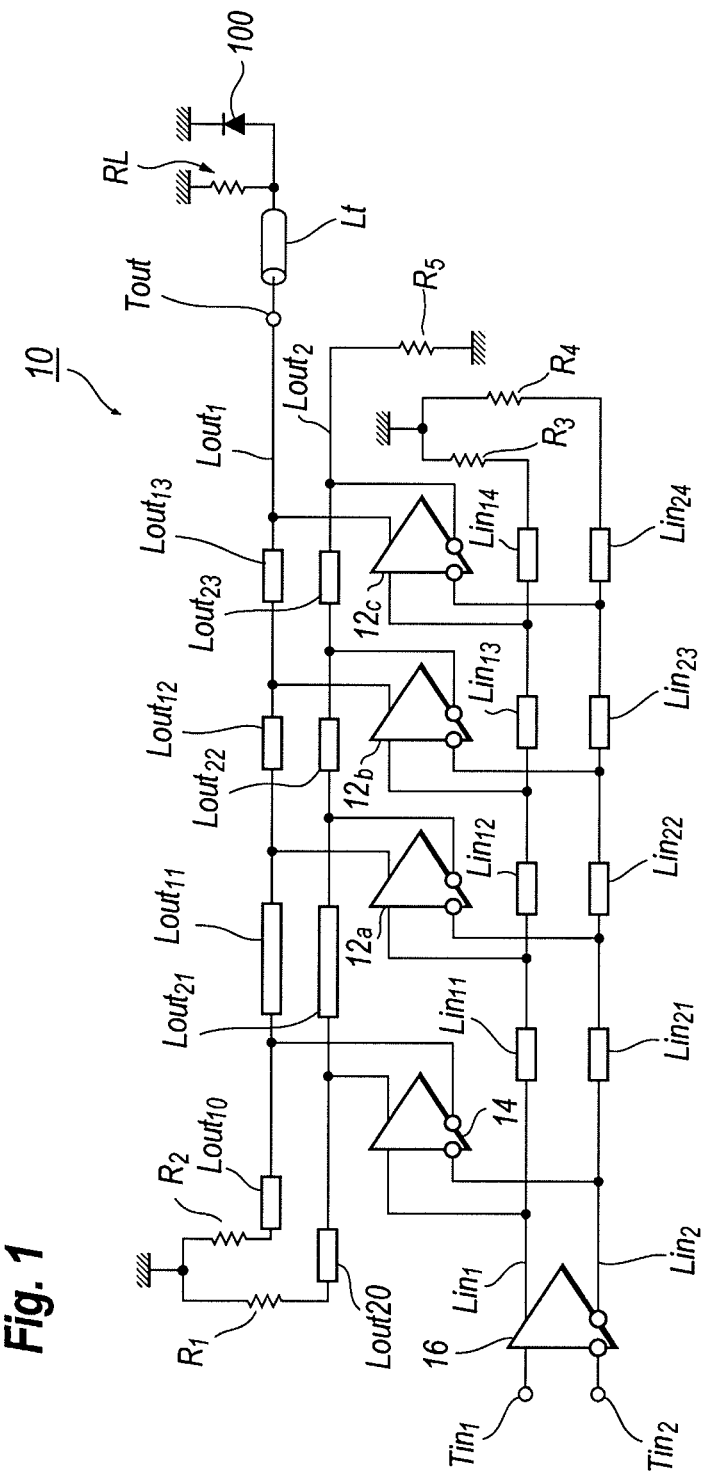
FIG. 1 is a circuit diagram of a TWA according to an embodiment of the invention.

FIG. 1 is a circuit diagram of a differential traveling wave amplifier (TWA) according to an embodiment of the invention. The TWA 10 is circuit applicable to drive an optical modulator 100, which is, for instance, an electro-absorption (EA) modulator. The EA modulator 100 shown in FIG. 1 is connected in parallel to a load resistor RL to terminate the transmission line Lt. The parallel circuit of the resistor RL and the EA modulator 100 is connected in an output Tout of the TWA 10 through the transmission line Lt.

The TWA 10 includes an array of differential circuits, 12a to 12c, of the first type, and another differential circuit 14 of the second type. The TWA 10 also provides input transmission lines, Lin1 and Lin2, and output transmission lines, Lout1 and Lout2. The former transmission lines, Lin1 and Lin2, provide input terminals, Tin1 and Tin2, a differential input buffer 16, and terminated by resistors, $R_3$ and $R_4$, to the ground. The input terminal Tin1 may receive an input signal with the positive phase; while, the other input terminal Tin2 may receive another input signal with the negative phase complementary to the positive phase signal.

One of the output transmission lines Lout1 is connected to the output terminal Tout; while, the other of the output transmission lines Lout2 is grounded via a resistor $R_5$. Also, the output transmission lines, Lout1 and Lout2, are terminated by respective resistors, $R_1$ and $R_2$, in a side opposite to the output terminal Tout.

Each of the differential amplifiers, 12a to 12c, of the first type is connected to the input transmission lines, Lin1 and Lin2, and receives the output of the input buffer 16. Specifically, each of the non-inverting input of the differential amplifiers, 12a to 12c, is connected to one of the input transmission lines Lin1 to receive the positive phase output of the input buffer 16; while, the inverting input of the differential amplifiers, 12a to 12c, is connected to the other of the input transmission lines Lin2 to receive the negative phase output of the input buffer 16. Thus, the differential amplifiers, 12a to 12c, operate as the non-inverting amplifier.

The differential amplifiers, 12a to 12c, of the first type may receive the complementary signals each provided to the input terminals, Tin1 and Tin2, with delays specific to respective amplifiers via the input buffer 16. The delay specific to respective differential amplifiers may be determined by the delay attributed to the input buffer and input transmission lines provided between the outputs of the input buffer 16 to the inputs of the amplifier. That is, the former delay due to the input buffer 16 may be determined by the arrangement and circuit elements involved in the input buffer 16; while, the delay of the transmission line may be determined by the inductance and capacitance components attributed thereto, specifically, the length of the transmission line.

The input transmission line Lin11 in FIG. 1 is put between the non-inverting input of the differential amplifier 12a of the first type and the non-inverting output of the input buffer 16, a delay of which may be determined by the capacitance and inductance thereof, and the input capacitance of the differential amplifier 12a. The input transmission line Lin21 is put between the inverting input of the differential amplifier 12a and the inverting output of the input buffer 16, a delay of which may be also determined by the inductance and capacitance thereof, and the input capacitance of the first differential amplifier 12a.

The input transmission line Lin12 is put between the non-inverting input of the amplifiers, 12a and 12b, whose delay may be determined by the inductance and capacitance components thereof, and the input capacitance of the second amplifier 12b. A situation same with the input transmission line lin12 may be applied to the other input transmission line Lin22 between the inverting inputs of two differential amplifiers, 12a and 12b. Also, the input transmission lines, Lin13 and Lin23, are put between the non-inverting or inverting input of the amplifiers, 12b and 12c, whose delay may be determined likewise to the aforementioned transmission lines.

The input transmission lines, Lin14 and Lin24, are connected to the inputs of the third amplifier 12c and pulled up to the ground by respective resistors, $R_3$ and $R_4$, where their delay may be determined by the inductance and capacitance components.

The delay attributed to the input transmission lines, Lin11 and Lin21, are substantially equal to each other. The same situation is reflected in two input transmission lines, Lin12 and Lin22, another two input transmission lines, Lin13 and Lin23, and rest to input transmission lines, Lin14 and Lin24, which is hereafter denoted as td. Accordingly, the first differential amplifier 12a receives the outputs of the input buffer 16 with a delay td, the second differential amplifier 12b receives them with a delay of 2×td, and the third differential amplifier 12c receives them with a delay of 3×td. Thus, respective differential amplifiers, 12a to 12c, of the first type receive the outputs of the input buffer 16 with delays specific thereto.

The differential amplifiers, 12a to 12c, of the first type inherently have a delay from the input to the output thereof substantially equal to each other. Furthermore, the TWA 10 includes output transmission lines, Lout 12 and Lout22, between non-inverting outputs and inverting outputs of amplifiers, 12a and 12b; and other two output transmission lines, Lout13 and Lout23, each between non-inverting outputs and between inverting outputs of two amplifiers, 12b and 12c. The delays of respective output transmission lines, Lout 12 to Lout23, may be determined by the inductance and capacitance thereof and the output capacitance of respective amplifiers, 12a to 12c.

The output transmission lines, Lout12 to Lout23, have a delay substantially equal to each other, which is also assumed to be td. That is, the first differential amplifier 12a receives the outputs of the input buffer 16 with the delay td and provides the output thereof to the output terminal Tout via two transmission lines, Lout12 and Lout22, whose total delay is 2×td. The second differential amplifier 12b receives the output of the input buffer 16 with the delay of 2×td and provides the output thereof to the terminal Tout with the delay of td. The third differential amplifier 12c receives the output of the input buffer 16 with the delay of 3×td and provides the output thereof to the terminal Tout with substantially no delay. Accordingly, the signal provided to the input terminal Tin1 may be appeared in the output terminal Tout via respective paths each including one of differential amplifier, 12a to 12c, but with the delay substantially equal to each other.

The TWA according to an embodiment of the invention shown in FIG. 1 may further include another differential amplifier 14 of the second type. The differential amplifier 14 of the second type directly receives the output of the input buffer 16 without any input transmission lines and transfers the outputs thereof to the output transmission lines, Lout11 and Lout21. A feature of the differential amplifier 14 of the embodiment is that the amplifier 14 receives the non-inverting output of the input buffer 16 in the non-inverting input thereof but the non-inverting output thereof is connected to the output transmission line Lout21 which is coupled to the output transmission lines, Lout12 and Lout13, for the inverting output of other amplifiers, 12a to 12c, of the first type. Accordingly, the output of the differential amplifier 14 of the second type may function as the inverting amplifier and the output thereof is reversely superimposed at the terminal Tout.

Moreover, the output transmission lines, Lout11 and Lout21, coupled to the differential amplifier 14 of the second type has a delay longer than the delay attributed to the other transmission lines, Lin11 to Lin23 and Lout12 to Lout23. Accordingly, the signal provided from the differential amplifier 14 and superposed at the terminal Tout inherently accompanies a delay greater than the delay 3×td attributed to other signals via other differential amplifiers, 12a to 12c, of the first time. The signal output from the TWA 10 superposed at the terminal Tout has a pre-emphasized shape. Specifically, the transmission lines, Lin11 to Lin23 and Lout 12 to Lout23, may have the delay of 5 ps, the transmission lines, Lout11 and Lout21, may have the delay of 10 ps, and the differential amplifier 14 of the second type may show the same delay attributed to the other differential amplifiers, 12a to 12c, of the first type.

Figure 2:
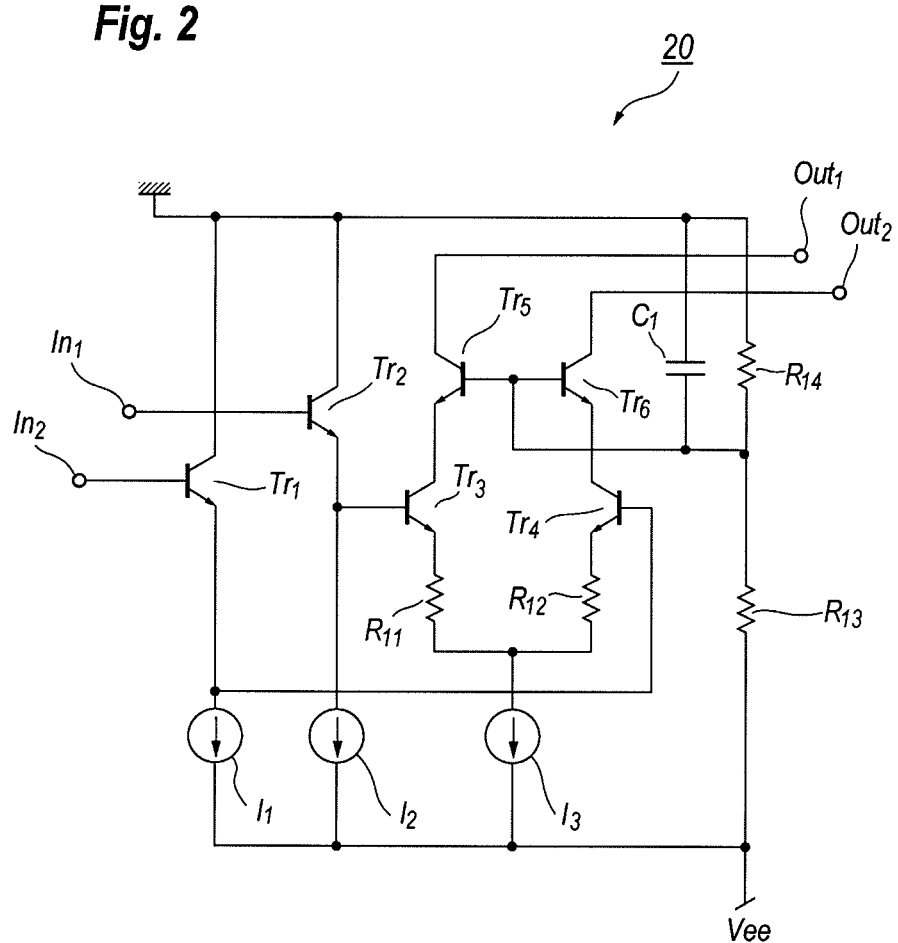
FIG. 2 is a circuit diagram of a differential amplifier implemented with the TWA shown in FIG. 1.

FIG. 2 is a typical circuit diagram for the differential amplifier 20 applicable to the differential amplifiers, 12a to 12c and 14. The amplifier 20 includes six bipolar transistors, $Tr_1$ to $Tr_6$, a capacitor $C_1$, four resistors, $R_{11}$ to $R_{14}$, and three current sources $I_1$ to $I_3$. The amplifier 20, which has a differential arrangement, may amplify signals complementary to each other and input to the terminals, $In_1$ and $In_2$, to output in the terminals, Out1 and Out2. A feature of the amplifier 20 is that it provides cascade transistors, $Tr_5$ and $Tr_6$, where they are fixedly biased in the base thereof by the resistor divider including two resistors, $R_{13}$ and $R_{14}$. The cascade transistors, $Tr_5$ and $Tr_6$, may reduce the collector bias of the paired transistors, $Tr_1$ and $Tr_4$, to enhance the high speed performance of the amplifier 20.

Specifically, the collector bias of the paired transistors, $Tr_3$ and $Tr_4$, may be set in a level determined by the voltage divider of two resistors, $R_{13}$ and $R_{14}$, lowered by the base-emitter bias of the cascade transistor, $Tr_5$ and $Tr_6$, the latter of which is the forward saturation voltage of the p-n junction diode and substantially equal to about 0.7 V. In an embodiment shown in FIG. 2, the fixed bias applied to the base of the cascade transistors, $Tr_5$ and $Tr_6$, is selected to set the junction capacitance between the collector and the base $C_{BC}$ of the paired transistors, $Tr_3$ and $Tr_4$, in a quasi-saturated region. In embodiments of the present application, transistors, $Tr_1$ to $Tr_6$, implemented within the differential amplifiers, 12a to 12c and 14, are made of compound semiconductor materials including in, what is called, the InP system; and have a structure of the double-hetero-bipolar transistor, InP-DHBT.

Figure 10:
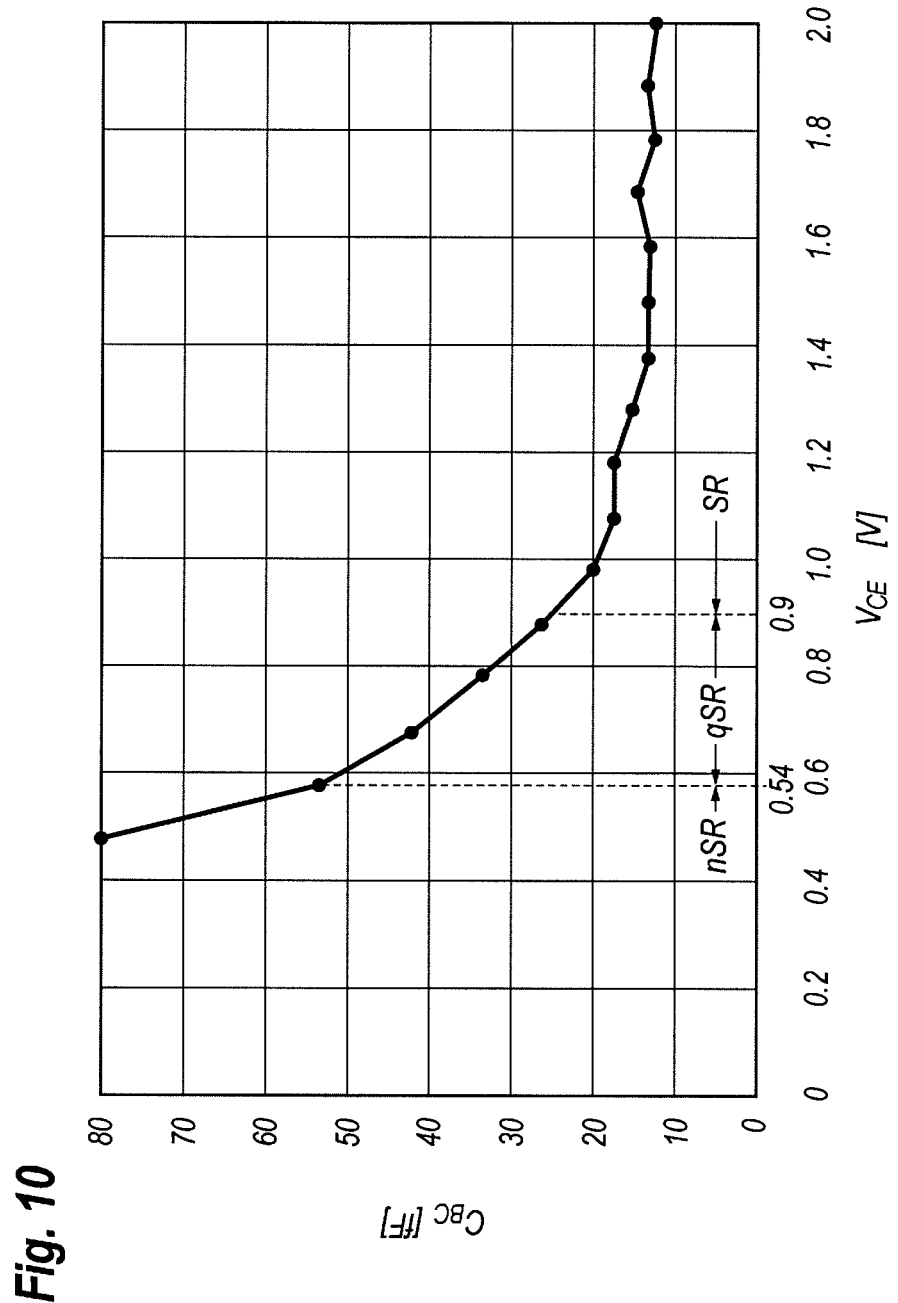
FIG. 10 shows a general relation of the collector-base junction capacitance $C_{BC}$ of a bipolar transistor against the collector-emitter bias $V_{CE}$.

FIG. 10 shows a general relation between the collector-base junction capacitance $C_{BC}$ against the collector bias $V_{CE}$. A bipolar transistor inherently provides the p-n junction between the base-collector and the base-emitter. When the collector is forwardly biased with respect to the emitter, the p-n junction between the base and the collector $V_{CB}$ is reversely biased, and the junction capacitance $C_{BC}$ thereof becomes proportional to $V^{-X}$, where V is the reverse bias applied to the junction and X is approximately between 1 and 2. In an ordinal amplifier, the amplifying transistor is biased in the collector thereof such that the collector-base junction is in the saturated region (SR) to reduce the capacitance $C_{BC}$ thereof. However, the paired transistors, $Tr_3$ and $Tr_4$, in the embodiment shown in FIG. 2, are biased such that the base-collector junction capacitance $C_{BC}$ is in the quasi-saturated (qSR) region to improve the high frequency performance of the TWA 10.

Figure 9:
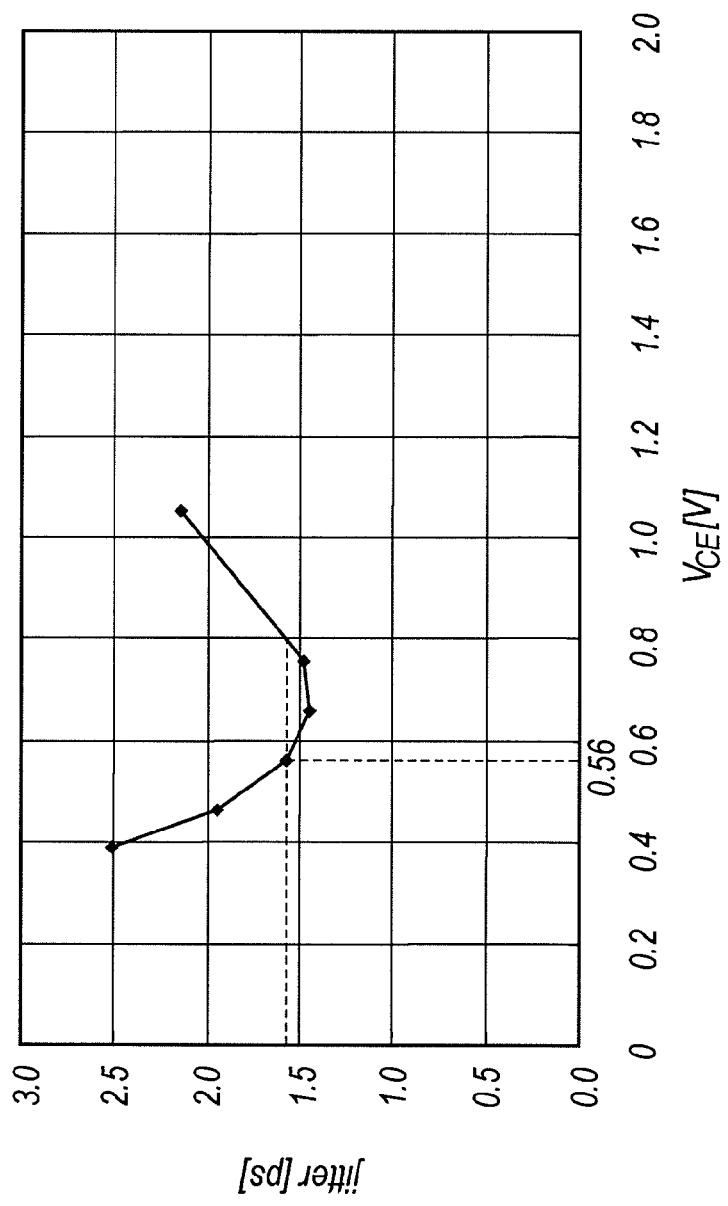
FIG. 9 shows a jitter characteristic of the TWA against the collector-emitter bias of the paired transistor in the differential circuit shown in FIG. 2.

FIGS. 8A to 8F are eye diagrams of the output of the TWA 10 depending on the collector bias $V_{CE}$ of the paired transistors, $Tr_3$ and $Tr_4$. When the collector bias $V_{CE}$ is greater than 0.76V, which corresponds to the saturated region SR in FIG. 10, the output from the TWA 10 shows large fluctuation in the low level. While, the output of the TWA 10 shows a substantial jitter when the collector bias $V_{CE}$ becomes less than 0.47V. The collector bias $V_{CE}$ between 0.56V and 0.66V shows an excellent diagram in the fluctuation of the high and low levels, and the jitter. FIG. 9 shows the jitter behavior of the output from the TWA 10 against the collector bias $V_{CE}$ for the paired transistors, $Tr_3$ and $Tr_4$. Reflecting the results shown in FIG. 8, the behavior shows a minimum in the collector bias $V_{CE}$ thereof in the quasi saturated region from $V_{CE}$=0.56 to 0.8 V. Collector biases less than 0.56 V in the non-saturated region (nSR) in FIG. 10, and those greater than 0.8 V corresponding to the region SR cause an increase of the jitter.

Figure 3:
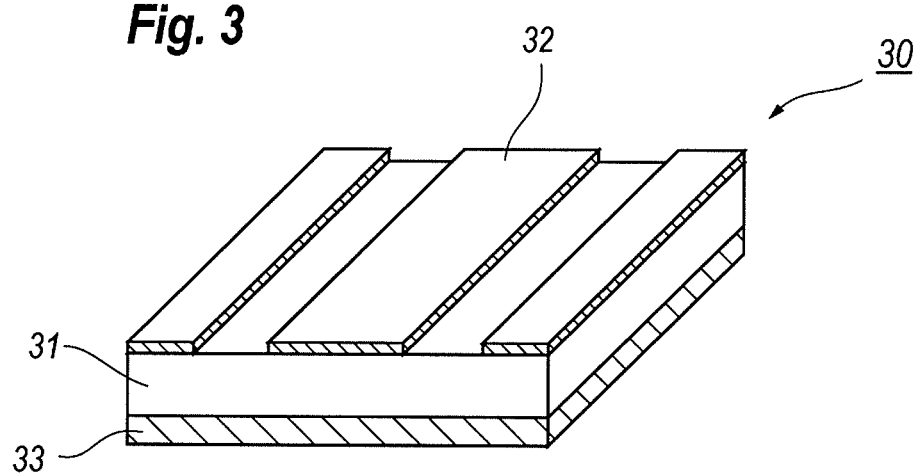
FIG. 3 is a perspective view of a co-planar transmission line applicable to the TWA shown in FIG. 1.

Next, transmission lines implemented within the TWA 10 will be described as referring to FIG. 3, which is a perspective view of the transmission line having the co-planar arrangement. As shown in FIG. 3, the co-planar transmission line 30 includes a metal line 32 disposed on a semiconductor substrate 31 whose back surface provides a ground metal 33. Then, the co-planar transmission line 30 may be integrally formed with the bipolar transistors, Tr1 to Tr6, above described and other passive components on the semiconductor substrate 31.

The metal line 32 comprises a metal thin film on the substrate 31; while, the ground metal 33 also, which extends in whole of the back surface of the substrate 31, comprises a metal thin film. The transmission lines, Lout11 and Lout21, have a longer delay compared with other transmission lines in the present embodiment, as described above. Such transmission lines with various delays may be accomplished only by adjusting the length of the metal line 32.

Next, an operation of the TWA 10 will be described as referring to FIG. 4, which includes timing charts attributed to respective differential amplifiers, 12a to 12c, and 14. That is, the timing charts FIGS. 4A to 4C correspond to those of the differential amplifiers, 12a to 12c, of the first type, while, the fourth timing chart FIG. 4D shows an output provided from the differential amplifier 14 of the second type. The last chart FIG. 4E shows a composite signal shape adding four components above at the output terminal Tout.

As shown in FIGS. 4A to 4C, although the TWA 10 includes the array of three differential amplifiers, 12a to 12c, of the first type each arranged in parallel between the input and the output of the TWA 10, the signals appeared at the output terminal Tout have the phase same to each other; namely, the signals passing respective differential amplifiers, 12a to 12c, may be aligned in the phase at the output terminal Tout.

The signal passing the differential amplifier 14 of the second type not only reverses the phase thereof but delays longer than the other signals passing the differential amplifiers, 12a to 12c, of the first type. Accordingly, the signal composed at the output terminal Tout has a pre-emphasis, or an overshoot and an undershoot, as shown in FIG. 4E. The signals at the output terminal Tout described above are current signals, and the currents each coming from differential amplifiers, 12a to 12c and 14, are composed and converted into a voltage signal by the load resistor RL.

Figure 5A:
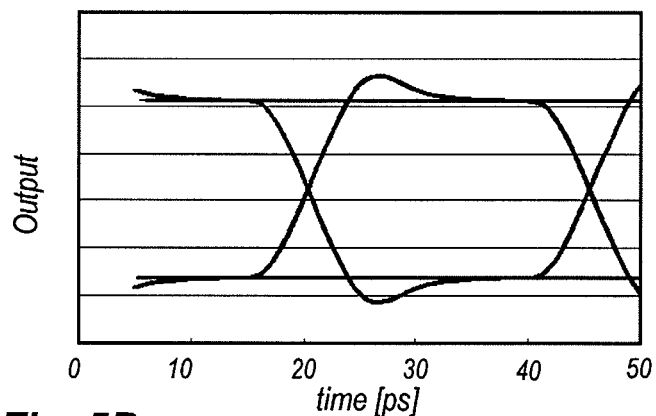
FIG. 5A is an eye diagram of the output of the TWA.
Figure 5B:
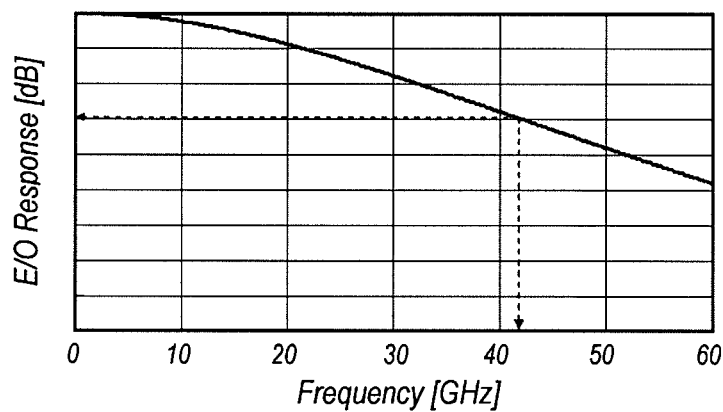
FIG. 5B is an E/O response of the optical modulator.
Figure 5C:
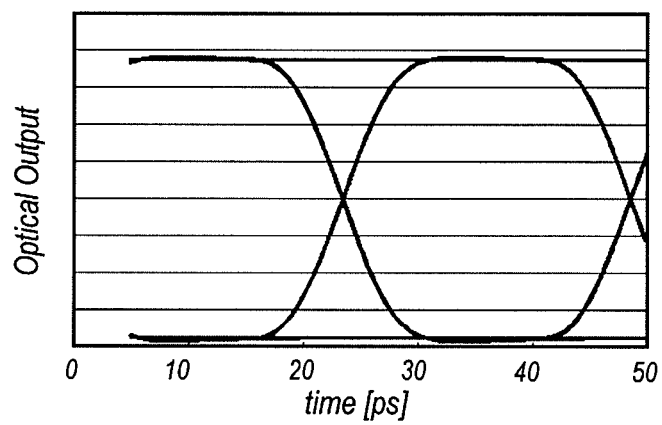
FIG. 5C shows an output waveform output from the optical modulator driven by the signal shown in FIG. 5A.

Some performance of the TWA 10 having the differential amplifier 14 of the second type will be shown as referring to FIGS. 5A to 5C, where FIG. 5A shows an eye diagram of the output voltage of the TWA 10, which is converted from the composed current by the load resistor RL, FIG. 5B shows an intrinsic response of the optical modulator 100, which is called as the E/O response of the modulator, and FIG. 5C shows an eye diagram of the optical output of the modulator 100 driven by the TWA 10 at a speed of 40 Gbps. While, FIGS. 6A to 6C compares the eye diagram of the electrical output of a conventional TWA without the differential amplifier 14 of the second type, and FIG. 6B shows an eye diagram of the optical output of the modulator whose E/O response is also shown in FIG. 5B, which has the E/O bandwidth of about 42 Gbps.

Figure 6A:
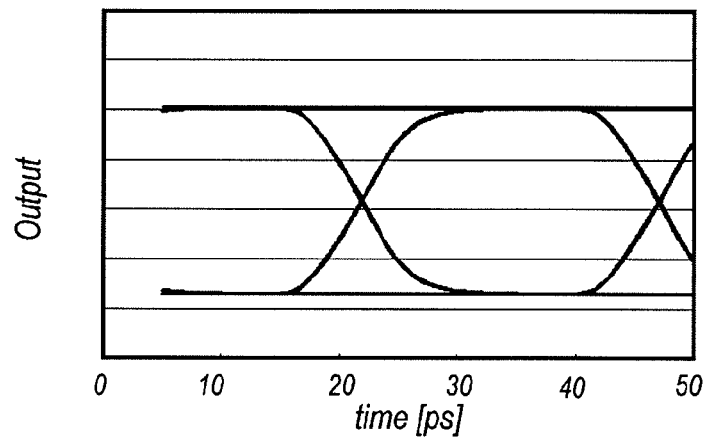
FIG. 6A is an eye diagram of the output by a conventional TWA without any pre-emphasis function.
Figure 6B:
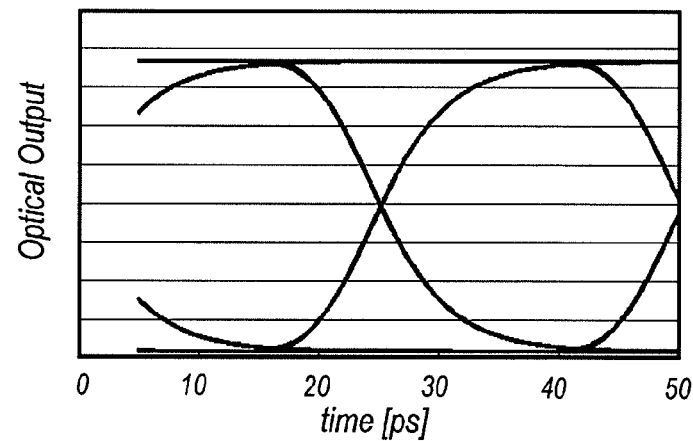
FIG. 6B shows an output waveform output from the optical modulator with the E/O conversion characteristic shown in FIG. 5B and driven by the signal shown in FIG. 6A.

Comparing FIG. 5A with FIG. 6A, the TWA 10 according to an embodiment of the invention shows some overshoot and undershoot in the leading and falling edges of the output because of the pre-emphasis by the differential amplifier 14 of the second type. However, when the optical modulator with the E/O conversion performance shown in FIG. 5B is driven by the TWA 10, the optical output therefrom may compensate the overshoot and undershoot but the rising time and the falling time of respective edges becomes less than 5 ps. While, when the optical modulator is driven by a conventional TWA without any pre-emphasis, the rising and the falling edges of the optical output becomes dull, around 10 ps, about twice of a case by the TWA 10 of the present embodiment. Thus, the TWA 10 according to an embodiment of the present invention may effectively contribute to enhance the high frequency performance of the light output from the optical modulator.

Figure 7:
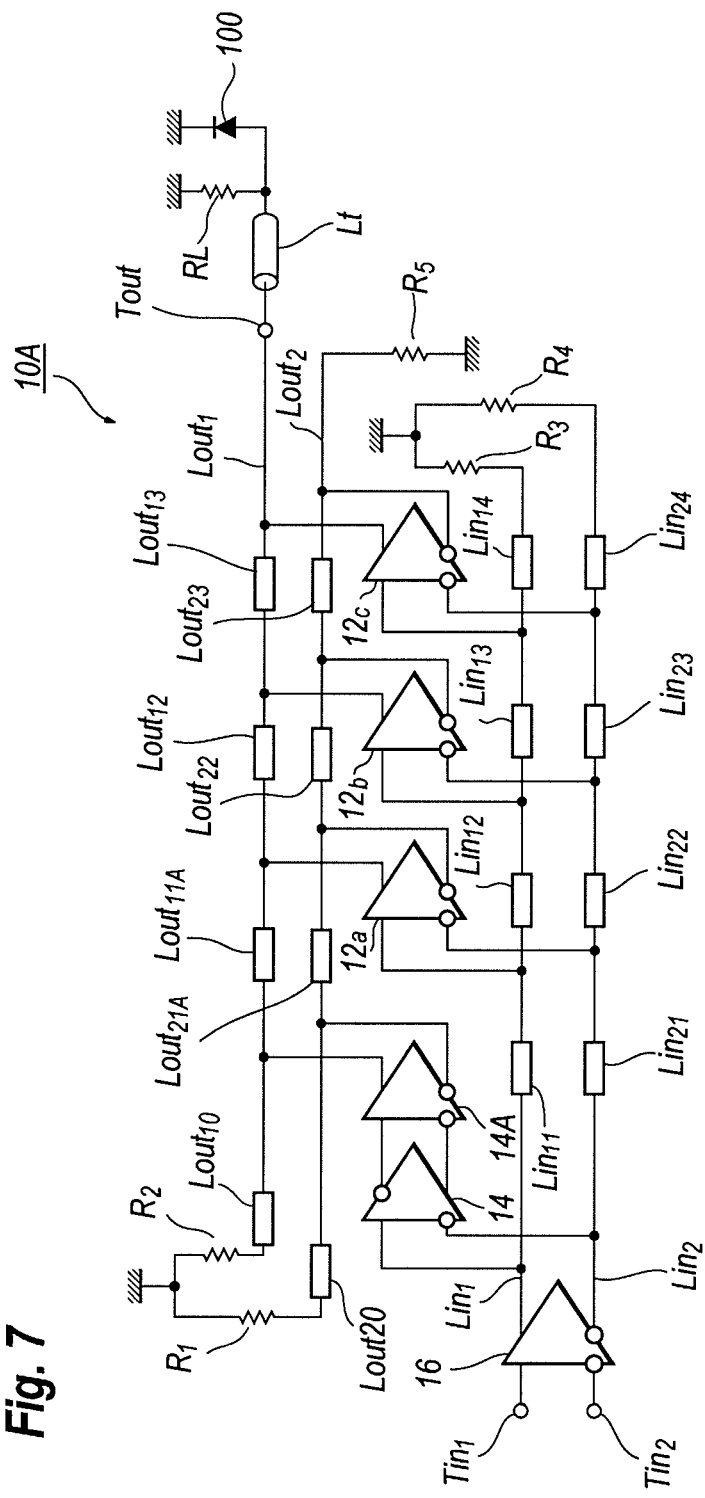
FIG. 7 is a circuit diagram of another TWA according to the second embodiment of the invention.
Figure 8A:
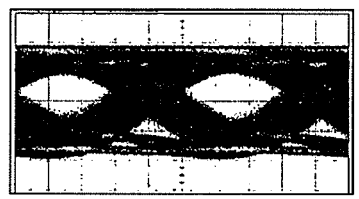
FIGS. 8A to 8F show eye diagrams of the output of the TWA as varying the collector-emitter bias of the paired transistor of the differential circuit shown in FIG. 2.
Figure 8B:
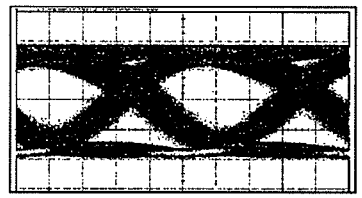
Figure 8C:
Figure 8D:
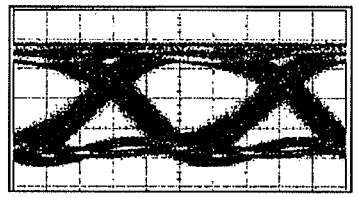
Figure 8E:
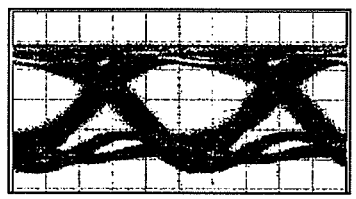
Figure 8F:

FIG. 7 is a circuit diagram of a modified TWA 10A according to the second embodiment of the present invention. The TWA 10A of the present embodiment provides the output transmission lines, Lout11A and Lout21A, instead of the output transmission lines, Lout11 and Lout21, of the aforementioned TWA 10. These modified transmission lines, Lout11A and Lout21a, show a specific delay substantially equal to the delay attributed to the other transmission lines, Lin11 to Lin23 and Lout12 to Lout23.

Moreover, the modified TWA 10A has another differential amplifier 14A in addition to the differential amplifier 14 of the second type, which is connected in series to and downstream of the differential amplifier 14. The differential amplifier 14 operates as an inverting amplifier, that is, the outputs thereof reverses the phase thereof, while, the additional differential amplifier 14A has the arrangement of the non-inverting amplifier, that is, the output of the additional differential amplifier 14A follows the phase of the signal input thereto.

In the TWA 10A, a difference between the delays, one of which is attributed to the signal passes of the differential amplifiers, 12a to 12c, of the first type, while, the other is due to another signal pass for the differential amplifier 14 of the second type, primarily comes from the existence of the additional differential amplifier 14A. The output transmission lines, Lout11 and Lout21, are necessary to have the length thereof about 400 to 600 μm to cause the difference of about 5 ps in the delay thereof, assuming that they have a width of 10 to 20 μm on the semiconductor substrate with a thickness of 75 to 200 μm.

On the other hand, the modified differential amplifier 14A of the second embodiments in the TWA 10A may extend only about a few tens of micron-meters square, which may be far smaller than the dimension of the output transmission lines, Lout11 and Lout21, of the first equipment. Thus, the modifier TWA 10 may make a physical size thereof small enough.

In the foregoing detailed description, the TWA according to the present invention have been described with reference to specific exemplary embodiments thereof. It will, however, be evident that various modifications and changes may be made thereto without departing from the broader spirit and scope of the present invention. For instance, the embodiments described above provide three differential amplifiers of the first type. However, the TWA may provide further amplifiers, for instance ten to fifteen amplifiers, as the first type. Also, the embodiments provide the semiconductor substrate on which the active devices such as bipolar transistors and the passive devices such as transmission lines are integrally formed.

Still further, the embodiments above described have the inverting amplifier in the top of the array of the amplifiers; that is, the inverting amplifier first receives the input signal. However, the embodiments, in particular, the second embodiment where the inverting amplifier accompanies with the non-inverting amplifier, may arrange the series circuit of the inverting amplifier and the non-inverting amplifier in a middle of the amplifier array. However, the substrate may be a type of the dielectric substrate having dielectric constant less than that of semiconductor material. Therefore, the present specification and figures are to be regarded as illustrative rather than restrictive.

What is claimed is:

1. A traveling wave amplifier (TWA), comprising:
    a plurality of non-inverting amplifiers, each non-inverting amplifier being in parallel between an input and an output of the TWA providing a signal having a first phase in the output with a first delay with respect to the input; and
    an inverting amplifier between the input and the output of the TWA, the inverting amplifier providing another signal having a second phase opposite to the first phase in the output with a second delay longer than the first delay.

2. The TWA of claim 1,
    wherein the non-inverting amplifiers and the inverting amplifier have a same configuration,
    wherein the inverting amplifier provides a transmission line connected to an output of the non-inverting amplifiers, and
    wherein the transmission line causes a third delay between the second delay and the first delay.

3. The TWA of claim 1,
    wherein the non-inverting amplifiers and the inverting amplifier have a same configuration,
    wherein the TWA further comprises another amplifier connected in series to the inverting amplifier, and
    wherein the another amplifier causes a delay between the second delay and the first delay.

4. The TWA of claim 1,
    wherein the non-inverting amplifiers and the inverting amplifier are differential amplifiers.

5. The TWA of claim 4,
    wherein a differential amplifier of the differential amplifiers includes a pair of transistors whose collector-emitter bias is set in a quasi-saturated region.

6. The TWA of claim 5,
    wherein the transistors are made of InP based semiconductor material.

7. A driver for driving a semiconductor modulator, comprising:
    an input to receive an input signal;
    an output to output an output signal to the semiconductor modulator;
    an N count of non-inverting amplifiers, where N is an integer and at least 1, wherein the non-inverting amplifiers are arranged substantially the same as each other and are configured to be connected in parallel between the input and the output, to receive the input signal with an input delay of td×n (1<=n<=N, td: unit delay), and to provide an amplified signal to the output with an output delay of td×(N−n); and
    a pre-emphasis unit connected in parallel to the non-inverting amplifiers between the input and the output of the driver, the pre-emphasis unit receiving the input signal with substantially no delay and providing a phase inverted signal to the output with an output delay of td'+td×(N−1),
    wherein td' is longer than td.

8. The driver of claim 7,
wherein the $n_{th}$ non-inverting amplifier includes an input terminal coupled to an input terminal of the $(n-1)_{th}$ non-inverting amplifier with a transmission line of a first type, and an output terminal coupled to an output terminal of the $(n+1)_{th}$ non-inverting amplifier with a transmission line of the first type,
wherein the pre-emphasis unit includes an inverting amplifier having an arrangement substantially the same as the non-inverting amplifiers, the inverting amplifier including an input terminal connected to the input of the driver and an output terminal connected with the output terminal of the first non-inverting amplifier with a transmission line of a second type, and
wherein the transmission line of the first type causes the unit delay td, and the transmission line of the second type causes another unit delay td'.

9. The driver of claim 7,
wherein the pre-emphasis unit includes an inverting amplifier and a non-inverting amplifier connected in series to and downstream of the inverting amplifier,
wherein the inverting amplifier receives the input signal with substantially no delay, and the non-inverting amplifier of the pre-emphasis unit provides the phase inverted signal to the output, and
wherein the inverting amplifier causes a difference between the other unit delay td' and the unit delay td.

10. The driver of claim 7,
wherein the non-inverting amplifiers and the pre-emphasis unit have a differential amplifier.

11. A traveling wave amplifier (TWA) having an input terminal for receiving an input signal and an output terminal for outputting an amplified signal, comprising:
an input delay line including a plurality of delay elements;
an output delay line including a plurality of delay elements;
a plurality of first amplifiers having an input node and an output node, the input node being connected to a node between two delay elements of the input delay line, the output node being connected to a node between two delay elements of the output delay line, the first amplifiers providing a portion of the amplified signal with a first delay from the input terminal to the output terminal; and
a second amplifier having an input node and an output node, the input node of the second amplifier receiving the input signal, the output node of the second amplifier being connected to one of delay elements of the output delay line unbound with the first amplifiers, the second amplifier providing another portion of the amplified signal with a second delay longer than the first delay and with reversed phase.

12. The TWA of claim 11,
wherein the delay elements of the input delay line and the delay elements of the output delay line, except for one of the delay elements of the output delay line, cause a first unit delay, and
wherein the one of the delay elements of the output delay line causes a second unit delay longer than the first unit delay.

13. The TWA of claim 11,
wherein the delay elements of the input delay line and the delay elements of the output delay line cause a first unit delay, and
wherein the second amplifier includes an inverting amplifier and a non-inverting amplifier connected in series to the inverting amplifier, the inverting amplifier having the input node of the second amplifier, the non-inverting amplifier having the output node of the second amplifier and an arrangement the same as the first amplifiers, and
wherein the inverting amplifier in the second amplifier causes a second unit delay.

14. The TWA of claim 11,
wherein the input delay line, the output delay line, the first amplifiers, and the second amplifier have a differential arrangement.

* * * * *